(12) United States Patent
Kashima et al.

(10) Patent No.: US 8,039,119 B2
(45) Date of Patent: Oct. 18, 2011

(54) TEXTURED SUBSTRATE FOR EPITAXIAL FILM FORMATION AND SURFACE IMPROVING METHOD OF TEXTURED SUBSTRATE FOR EPITAXIAL FILM FORMATION

(75) Inventors: Naoji Kashima, Aichi (JP); Shigeo Nagaya, Aichi (JP); Kunihiro Shima, Gunma (JP); Shuichi Kubota, Gunma (JP)

(73) Assignees: Chubu Electric Power Co., Inc., Aichi (JP); Tanaka Kikinzoku Kogyo K.K., Tokyo (JP)

( * ) Notice: Subject to any disclaimer, the term of this patent is extended or adjusted under 35 U.S.C. 154(b) by 447 days.

(21) Appl. No.: 12/175,514

(22) Filed: Jul. 18, 2008

(65) Prior Publication Data

US 2009/0053550 A1    Feb. 26, 2009

(30) Foreign Application Priority Data

Aug. 21, 2007    (JP) ................. 2007-214364

(51) Int. Cl.
| | |
|---|---|
| *B32B 15/04* | (2006.01) |
| *B32B 15/18* | (2006.01) |
| *B32B 15/20* | (2006.01) |
| *B05D 5/00* | (2006.01) |
| *B05D 1/18* | (2006.01) |
| *C25D 3/00* | (2006.01) |

(52) U.S. Cl. ........ 428/687; 428/612; 428/670; 428/671; 428/672; 428/673; 428/674; 428/650; 428/680; 428/681; 428/682; 428/686; 428/332; 428/336; 427/383.7; 427/436; 977/810; 977/832

(58) Field of Classification Search .......... 428/612, 428/668, 669, 670, 671, 672, 673, 674, 675, 428/676, 680, 687, 686, 213, 220, 336, 332, 681, 650, 682

See application file for complete search history.

(56) References Cited

U.S. PATENT DOCUMENTS 6,428,635 B1    8/2002    Fritzemeier et al. .......... 148/435
(Continued)

FOREIGN PATENT DOCUMENTS

JP    02-006087    1/1990
(Continued)

OTHER PUBLICATIONS

Gammel, "Lattice Structure," (Feb. 1998), 3 pages, downloaded from www.matpak.de/info/Nuclear/Elements/lattice.html on Mar. 23, 2011.*

(Continued)

*Primary Examiner* — Michael Lavilla
(74) *Attorney, Agent, or Firm* — Roberts & Roberts, LLP

(57) ABSTRACT

Orientation degree and smoothness of a substrate surface better than those of conventional ones are provided in a textured substrate for epitaxial thin film growth. The present invention is a textured substrate for epitaxial film formation, including a crystal orientation improving layer made of a metal thin film of 1 to 5000 nm in thickness on the surface of the textured substrate for epitaxial film formation having a textured metal layer at least on one surface, wherein differences between orientation degrees ($\Delta\phi$ and $\Delta\omega$) in the textured metal layer surface and orientation degrees ($\Delta\phi$ and $\Delta\omega$) in the crystal orientation improving layer surface are both 0.1 to 3.0°. Further, when another metal different from the metal constituting this textured substrate crystal orientation improving layer is added equivalent to a thin film which is 30 nm or less, and subsequently is subjected to heat treatment, the smoothness of that surface can be improved. At this time, the surface roughness of the substrate surface becomes 20 nm or less.

12 Claims, 1 Drawing Sheet

Cu Substrate surface

Crystal orientation improving layer

U.S. PATENT DOCUMENTS

| | | | |
|---|---|---|---|
| 2004/0033904 A1 | 2/2004 | Moore et al. | 505/100 |
| 2006/0049057 A1* | 3/2006 | Bhattacharya et al. | 205/266 |
| 2008/0103052 A1 | 5/2008 | Ignatiev et al. | 505/473 |

FOREIGN PATENT DOCUMENTS

| | | |
|---|---|---|
| JP | 2001-518564 | 10/2001 |
| JP | 2006-513553 | 4/2006 |
| WO | WO 01/83855 | 11/2001 |

OTHER PUBLICATIONS

Yu, et al. "LZO Covered Cu-Based Substrates." Journal of Allys and Compounds, vol. 460, No. 1-2, Jun. 2, 2007, pp. 519-523.

Yu, et al. "New Cu-Ni Substrate for Coated Conductors." Material Sciences Forum, vol. 546-549, May 15, 2007, pp. 1877-1880.

Varanasi, Chakrapani V., et al. "Biaxially Textured Copper and Copper-Iron Alloy Substrates For Use in Yba[2]Cu[3]O[7][−][x]." Superconductor Science and Technology. 2006. vol. 19, pp. 85-95.

Gladstone, T.A., et al. "Control of Texture in Ag and Ag-Alloy Substrates for Superconducting Tapes.", Superconductor Science and Technology, 13(2000), pp. 1399-1407.

* cited by examiner

Cu Substrate surface

Crystal orientation improving layer

Immediately after forming crystal orientation improving layer (Ni)

After Pd plating

TEXTURED SUBSTRATE FOR EPITAXIAL FILM FORMATION AND SURFACE IMPROVING METHOD OF TEXTURED SUBSTRATE FOR EPITAXIAL FILM FORMATION

BACKGROUND OF THE INVENTION

1. Field of the Invention

The present invention relates to a textured substrate applied to a thin film formation surface in a textured substrate for epitaxial film formation. More in detail, the invention relates to a textured substrate further improved in crystal orientation and surface smoothness.

2. Description of the Related Art

In recent years, the material whose specific property an epitaxial crystal structure has is focused on has been used in various fields. Its typical examples include a superconducting conductor applied to a variety of power equipment and an oxide superconducting material constituting a superconducting shield and the like. The material having this epitaxial crystal structure is generally poor in workability, and is disadvantageous in cost when manufacturing a bulk material, and for this reason, it is often used in the form of its thin film on a predetermined substrate.

Since a substrate for epitaxial film formation allows an epitaxial crystal having an orientation structure to grow, its surface also is required to have an orientation structure. As such substrate, a textured substrate made of copper, silver, nickel or alloy of these metals and the like, and including a textured metal layer having a biaxially textured {100}<100>cube texture is used (for example, "Biaxially textured copper and copper-iron alloy substrates for use in YBa[2]Cu[3]0[7][−][×]" (Superconductor science and technology ISSN0953-2048, 2006, vol.19, pp.85-95), "Control of texture in Ag and Ag-alloy substrates for superconducting tapes" by T A Gladstone, JC Moore, B M Henry, S Speller, C J Salter, A JWilkinson and C R M Grovenor, Department of Materials, University of Oxford, Supecond, Sci. Techno. 13(2000) 1399-1407, printed in the UK, National Publication of International Patent Application No. 2001-518564 and National Publication of International Patent Application No. 2006-513553). These textured substrates are made by bonding a metal base such as stainless steel to a metal plate, i.e. textured metal layer such as a textured copper as a reinforcing material for securing handleability as a substrate.

BRIEF SUMMARY OF THE INVENTION

It is often the case that the quality of the textured substrate is evaluated by orientation degrees ($\Delta\phi$ and $\Delta\omega$) of the textured metal layer. The orientation degree means a drift angle for the substrate of a predetermined crystal plane of the metal constituting the textured metal layer and its crystal axis. These orientation degrees can be determined by performing a $\phi$ scan and a $\omega$ scan in X-ray diffraction analysis of the textured substrate, and by measuring its full width at half maximum (FWHM).

Further, in the textured substrate, it is common to form the textured metal layer by subjecting a plate material (foil material) such as copper to cold working or hot processing and heat treatment so as to be re-crystallized. By such cold working and heat treatment, the orientation degree $\Delta\phi$ of the textured metal can be improved. Being different depending on the kind of constituent metals, the orientation degree $\Delta\phi$ of copper relatively easily textured is approximately 5°, and the orientation degrees $\Delta\phi$ of nickel and silver can be increased up to the extent of 6° and 9°.

However, the improvement of the orientation degree $\Delta\phi$ is restricted to the above described values even if the working condition and the heat treatment condition were adjusted, and more improvement was deemed difficult. Further, though the orientation degree $\Delta\phi$ is adjustable, it was deemed difficult to improve the orientation degree $\Delta\omega$ no matter how the working condition and the heat treatment condition were adjusted.

Any of the orientation degrees $\Delta\phi$ and $\Delta\omega$ of the textured metal layer affects an orientation degree of the epitaxial thin film formed on the metal layer, and eventually, determines the property of the epitaxial thin film. Even slight improving in these orientation degrees facilitates the practical use of epitaxial growth materials such as superconducting materials.

Hence, an object of the present invention in the textured substrate for epitaxial thin film growth is to provide a more improved orientation degree of the surface and an improving method of an orientation degree of the oriented substrate, and to provide a textured substrate capable of manufacturing an epitaxial thin film having a more excellent characteristic than heretofore.

To achieve the object, the present invention is a textured substrate for epitaxial thin film formation, which is made of a metal thin film on the surface of the textured metal layer and includes a crystal orientation improving layer of 1 to 5000 nm in thickness, wherein differences between the orientation degrees ($\Delta\phi$ and $\Delta\omega$) in the textured metal layer surface and the orientation degrees ($\Delta\phi$ and $\Delta\omega$) in the crystal orientation improving layer surface are 0.1 to 3.0°, respectively, in the textured substrate for epitaxial thin film formation having the textured metal layer at least on one surface.

The present inventors have found a phenomenon, wherein, when a metal thin film equivalent to or less than a certain film thickness is formed on the substrate having a textured metal layer, the orientation degree in the surface is improved in orientation degrees in comparison to the textured metal layer which is a base thereof. The gist of the present patent application is that, even when it is difficult to improve the orientation degree of the textured metal layer itself of the substrate, a metal thin film is formed as a crystal orientation improving layer by using this phenomenon, so that the orientation degree of the substrate surface is improved. Hereinafter, the detail of the present invention will be described.

The present invention is premised on being applied to the textured substrate including a textured metal layer. The metal constituting this textured metal layer, as long as they are capable of texturing the crystal, is not particularly limited. It is preferably made of the above described copper, silver, nickel or an alloy of these metals. Further, its crystal orientation, though depending on crystal structure of constituent metals, is a {100}<001> cube texture in the metal of a face-centered cubic lattice of copper and the like. The orientation degrees $\Delta\phi$ and $\Delta\omega$ of the textured metal layer are preferably values as small as possible, respectively, and are preferably 5 to 9° because the crystal orientation improving layer improves these orientation degrees with the orientation degree of the textured metal layer as a reference.

In the present invention, the film thickness of the crystal orientation improving layer is required to be 5000 nm (5 μm) or less. When the film thickness is increased more than that value, its object cannot be achieved since the film is grown in priority orientation which depends on the film forming method of the crystal orientation improving layer. Further, the reason why the lower limit value of the film thickness of the improving layer is set to 1 nm is because an effect of the orientation degree improvement cannot be otherwise obtained. The film thickness of the crystal orientation improving layer is preferably set to 100 to 3000 nm since the thickness within this range is the highest in the improving effect of the orientation degree.

The configuration of the metal thin film which is the crystal orientation improving layer is preferably composed of the metal having the same crystal structure as the textured metal layer serving as its base. As is described later, though the crystal orientation improving layer is formed by epitaxial growth, it has preferably the same crystal structure as the textured metal layer in order to improve the crystal orientation, while maintaining the same crystal orientation as the textured metal layer. Consequently, when the textured metal layer is made of the metal having the face-centered cubic lattice of copper and the like, it is preferable to form the thin film of the metal having the same face-centered cubic lattice. More preferably, the metal constituting the crystal orientation improving layer is further preferably 20% or less in difference of lattice constant in addition to the sameness of the crystal structure.

From the conditions regarding the crystal structure and the lattice constant, preferable as the metals constituting the crystal orientation improving layer include nickel, copper, silver, aluminum, gold, platinum, palladium, rhodium, and iridium. Particularly preferable from a view of the orientation degree improving effect is nickel and silver. The crystal orientation improving layer as described above is preferably formed by the method by epitaxial growth such as plating as described later. This is for maintaining the orientation degree of the textured substrate.

The textured substrate including the crystal orientation improving layer described above is improved further in orientation degree in the surface within the range of 0.1 to 3.0° than the textured metal layer. The improving width of this orientation degree is reduced by 0.1 to 3.0° for both of the orientation degrees $\Delta\phi$ and $\Delta\omega$.

Now, according to the present inventors, the crystal orientation improving layer formed by the epitaxial growth sometimes forms an extremely fine unevenness of sub-micron order on its surface. This is considered due to its growth mechanism. That is, due to the fact that, in the epitaxial growth, the metal crystal is directed to a constant growth direction, while laminating on the base in the relation of cube on cube, and therefore, an unevenness corresponding to the growth surface and the growth direction is generated on the outermost surface. This unevenness, though extremely fine, is likely to cause a fine distortion and affect its characteristic in a case when the superconducting materials and the like are epitaxially grown on its surface.

Hence, to form a much higher quality epitaxial film on the crystal orientation improving layer, the application of the substrate having the crystal orientation improving layer in which even the fine unevenness as described above is not present is preferable. Specifically, its surface roughness is preferably 20 nm or less. By this, a much higher quality epitaxial film can be formed on the crystal orientation improving layer. Note that the surface roughness in the present invention means an arithmetic mean deviation of the profile (Ra). Further, a preferable lower limit of the surface roughness is 0.1 nm.

The crystal orientation improving layer of the textured substrate according to the present invention contains another metal different from the metal constituting the crystal orientation improving layer on its surface, and its amount is equivalent to the film thickness which is 30 nm or less. Another metal is originated from a metal added to smooth the crystal orientation improving layer surface as described later. Further, its existing amount is equivalent to 30 nm or less of the film thickness. The "equivalent to film thickness" is calculated from the surface area of the crystal orientation improving layer and the existing amount or weight and density of another metal. The reason why such an expression is used is because another metal is extremely small in existing amount, and therefore, it does not always form a fully uniformed layer and cover the crystal orientation improving layer, but is dotted sometimes on the crystal orientation improving layer. The other metals added to this crystal orientation improving layer preferably include precious metals such as platinum, gold, silver, palladium, rhodium, and iridium.

Further, the substrate which is subjected to the process of adding another metal to the crystal orientation improving layer and is improved in smoothness becomes an alloy in which the crystal orientation improving layer contains a metal element constituting the textured metal layer. This is because, as described later, a process of improving the surface smoothness performs heat treatment after adding other metals, and by this heat treatment, the metal element constituting the textured metal layer is diffused into the crystal orientation improving layer. For example, nickel is formed on copper which is the textured metal layer as the crystal orientation improving layer, and when this layer is added with palladium and the like, and is subjected to the heat treatment, the crystal orientation improving layer becomes a nickel-copper alloy including copper. However, even when such alloying occurs, it does not affect the crystal orientation and the surface smoothness of the substrate surface.

Note that the textured substrate for the epitaxial film growth according to the present invention may be turned into a single layer substrate including the textured metal layer only. Further, similarly to the above described conventional art, the substrate may be clad with a base material for securing the strength. In this case, the base material used for the textured substrate is preferably a material made of any of stainless steel and nickel alloy, such as for example Hastelloy alloy, Inconel alloy, Monel alloy. Further, the thickness and shape of the textured substrate are not particularly limited, and the shape according to the application such as a plate-shape, a foil-shape, a tape-shape, and the like can be applied. When the clad material is used, the surfaces of both sides may be bonded with the textured metal layer.

The manufacturing method of the textured substrate for epitaxial film formation according to the present invention, that is, the surface improving method for improving crystal orientation of the textured metal layer allows a metal thin film of 1 to 5000 nm in thickness to be epitaxially grown on the surface of the textured metal layer of the textured substrate.

As a method of carrying out epitaxial growth of a metal thin film for improvement of the orientation degree, no particular restriction is imposed, and the metal thin film can be manufactured by a variety of thin film manufacturing processes such as PLD (pulse laser deposition method), CVD (chemical vapor deposition method), sputtering, vacuum evaporation, ion plating, ion beam evaporation, spin coating, MBE (molecular beam epitaxy method), and plating. A preferable forming method of the metal thin film is plating.

On the other hand, as a method of smoothing the surface of the crystal orientation improving layer, the polishing by nano-order level may be performed on its surface. This polishing may be performed by chemical polishing in addition to mechanical polishing or a combination thereof. However, though the surface smoothing by the polishing is possible, in that case, the crystal orientation improving layer is scraped by several μm order, and therefore, it is difficult to polish the thin film, while controlling the film thickness in order to display the performance of the crystal orientation improving layer. Hence, the present inventors have found out a method of smoothing the crystal orientation improving layer surface without depending on the polishing.

This method of smoothing crystal orientation improving layer surface, after forming a crystal orientation improving layer, adds another metal different from the metal constituting the crystal orientation improving layer to the surface equivalent to 30 nm or less of the film thickness, and subsequently performs heat treatment.

The reason why the smoothness of the crystal orientation improving layer surface is improved by adding a slight amount of the dissimilar metal to the metal crystal orientation improving layer surface and further performing heat treatment in this manner is not necessarily clear. According to the study by the present inventors, since the crystal orientation improving layer surface having the unevenness formed by the epitaxial growth is high in surface energy, and primarily has a tendency to be smooth and stabilized by heat treatment. The dissimilar metal of a slight amount added during this process has a so-called catalytic action for promoting the surface smoothness by being solid-soluble with the metal constituting the crystal orientation improving layer, thereby the unevenness of the nano-order is considered to disappear. The reason why the amount of the added metal is described as "equivalent to the film thickness" is because, as described above, its amount is extremely small. The lower limit value of this added amount is 0.5 nm.

The metal having such catalytic action is not limited if it is different from the constituent metal of the crystal orientation improving layer. Preferably, it is a metal being solid-soluble with the constituent metal of the crystal orientation improving layer, and a metal being a complete solid solution or having a solid-solution limit of 1% or more for the constituent metal of the crystal orientation improving layer. As a preferable specific example, precious metals such as platinum, gold, silver, palladium, iridium, rhodium, and the like are preferable. This is because these precious metals, particularly, platinum, gold, and palladium are strong in catalytic action for the smoothness, and are great in surface improving property.

The method of adding different metals is not particularly limited if capable of controlling and yet adding a slight amount of the metal such as equivalent to 30 nm or less of the film thickness. A preferable method is a deposition manufacturing process such as PLD, CVD, sputtering, vacuum evaporation, ion plating, ion beam evaporation, spin coating, MBE, plating, and the like, and a particularly preferable method is plating.

The heat treatment temperature is 400° C. or more, and is preferably set to a melting point or less of the added metal. This is because, when the temperature is 400° C. or less, the migration of the atoms for smoothing the surface becomes slow. Further, a heat treatment time is preferably set for ten minutes to two hours. This is because, when the heat treatment time is set to ten minutes or less, the migration of the atoms for smoothing the surface become insufficient, and even when the heat treatment is performed for more than two hours, no difference in the effect is made. The atmosphere of the heat treatment is not particularly limited if it is non-oxidative atmosphere.

As described above, the textured substrate for the epitaxial film formation according to the present invention has further improved the orientation degree of the substrate which has been improved in orientation degree to the fullest extent by the conventional method. Further, the surface roughness thereof is regulated by nano-order, so that a high quality epitaxial film having a high crystal orientation and exerting an expected characteristic can be formed. The epitaxial film formed by using the present invention is not particularly limited if formed by the epitaxial growth, and for example, can be suitably used for an oxidative superconducting conductor, and can form a good superconducting conductor layer excellent in crystal orientation.

DETAILED DESCRIPTION OF THE PREFERRED EMBODIMENTS

Hereinafter, preferred embodiments in the present invention is described.

First Embodiment

Formation and Study of Crystal Orientation Improving Layer

First, a tape-shaped copper plate of 1000 μm in plate thickness was prepared, and this copper plate was set to a reduction ratio of 95% by rolling, and was cold-rolled at room temperature and made into a tape material of 50 μm. After rolling, the copper tape was subjected to a heat treatment, so that the crystal was textured. This heat treatment was performed by heating at the temperature of 750° C. for two hours in the atmosphere made of a nitrogen gas 95% and a hydrogen gas 5%.

The copper substrate subjected to the above described orientation process was plated with nickel as a crystal orientation improving layer. When plated with nickel, the substrate was subjected to acid degreasing and electrolytic degreasing, and subsequently was subjected to electrolytic plating in a nickel plating bath (watt bath). The plating conditions were temperature of 40° C. and current density of 1 A/dm$^2$, and the film thickness was adjusted by variously changing the plating time, thereby plating nickels of 500 nm and 1000 nm. Note that, in the case of forming nickel by plating as a crystal orientation improving layer, the conditions are preferably set at current density 1 to 5 A/dm$^2$ and within the range of bath temperatures of 40 to 60° C.

Figure 1:
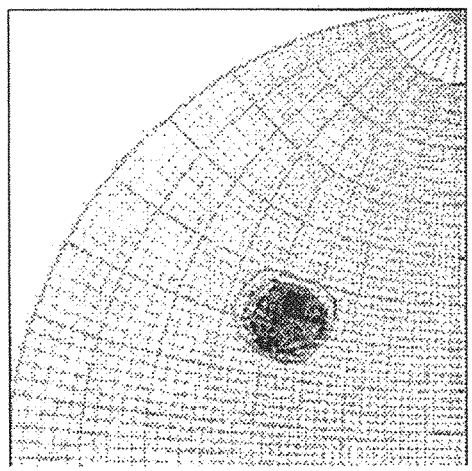
FIG. 1 is a pole figure of a textured substrate (Ni: 500 nm) according to a first embodiment.
Figure 1:
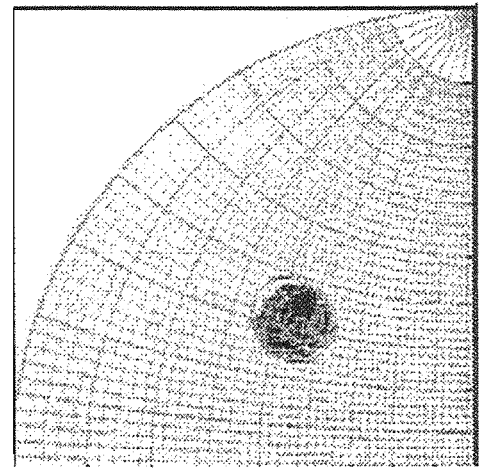

The crystal orientation of the textured substrate including the crystal orientation improving layer made of nickel was evaluated. This evaluation was based on an X-ray diffraction analysis, and pole figure measurement, a φ scan, and an ω scan were performed. A full width at half maximum was measured on each of the φ scan and the ω scan, thereby determining the orientation degrees Δφ and Δω. For the orientation degree Δω, both the plate width direction (TD) and the rolling direction (RD) were measured. FIG. 1 shows a pole figure. Further, Table 1 shows each value. Note that, these results show the measurement result of the substrate before plating as a comparison example 1.

TABLE 1

| | Configuration | | | Δω | |
|---|---|---|---|---|---|
| | Substrate | Improving layer | Δφ | TD | RD |
| Ex. 1 | Cu | Ni (500 nm) | 4.57° | 5.57° | 4.64° |
| Ex. 2 | | Ni (1000 nm) | 4.51° | 4.90° | 4.41° |
| Com. Ex. 1 | | — | 5.17° | 7.46° | 5.87° |

From FIG. 1, it is appreciated that any of the substrates is a {100}<100> cube texture, and has a good textured structure. From Table 1, it is appreciated that the substrate plated with nickel as a crystal orientation improving layer was improved in orientation degree Δφ by 0.5° or more. Further, with respect to the orientation degree Δω, the improved width was much greater, and was improved by 1° or more. In this manner, in the present embodiment, in addition to the improvement of the orientation degree Δφ, the orientation degree Δω was also improved, which was difficult heretofore. Further, similarly to a second example, the setting of the values of both of the orientation degrees to 4° plus less than 1° is preferable in order to secure the property of the epitaxial film formed on the substrate.

<Improvement and Study of Surface Smoothness>

Next, the improvement of the surface smoothness of the crystal orientation improving layer was studied. The substrate plated with nickel of 500 nm as described above was plated with palladium, gold, silver, platinum, and rhodium. After plating, a heat treatment was performed. All the plating employed commercially available plating solutions, and adjusted an adding amount equivalent to the film thickness by adjusting a plating time at the bath temperature 30 to 50° C. and the current density 1 to 3 A/dm². Further, the heat treatment condition was 700° C. for one hour, and the heat treatment was performed in non-oxidative atmosphere.

Figure 2:
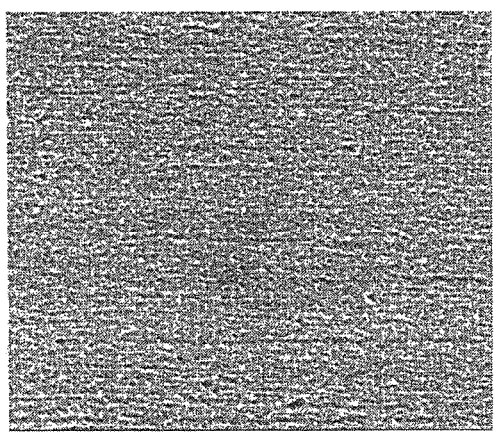
FIG. 2 is a photo showing a surface morphology of the substrate in a case when palladium is plated in a slight amount (5 nm).
Figure 2:
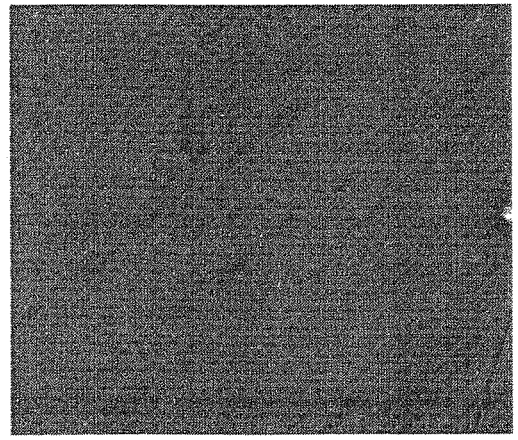

With respect to the textured substrate manufactured by the above described process, observation through a SEM on the surface morphology before and after adding the metal and evaluation through an AFM on the surface roughness were conducted. This study has been also performed on a nickel interlayer surface before plated with palladium. The observation result of the surface morphology is shown in FIG. 2, and the measurement result of the surface roughness is shown in Table 2.

TABLE 2

| | Configuration | | | | Δω | |
|---|---|---|---|---|---|---|
| | Substrate/Improving layer | Added metal * | Surface roughness | Δφ | TD | RD |
| Ex. 1 | Cu/Ni | — | 30 nm | 4.57° | 5.57° | 4.64° |
| Ex. 3 | (500 nm) | Pd (5 nm) | 5 nm | 4.84° | 5.60° | 4.57° |
| Ex. 4 | | Au (5 nm) | 2 nm | 4.62° | 5.06° | 4.16° |
| Ex. 5 | | Ag (10 nm) | 15 nm | 4.80° | 4.96° | 4.10° |
| Ex. 6 | | Pt (5 nm) | 5 nm | 4.33° | 4.96° | 5.09° |
| Ex. 7 | | Rh (10 nm) | 17 nm | 4.95° | 4.89° | 5.01° |
| Com. Ex. 2 | | Pd (50 nm) | 70 nm | 6.05° | 6.54° | 6.23° |

* Numerical values in parentheses are added amounts equivalent to film thickness From FIG. 1, it is appreciated that the surface after the formation of the nickel crystal orientation improving layer forms extremely minute unevenness. The surface roughness thereof was 30 nm from a result of measurement (Example 1). In a third example in which the nickel layer was plated with palladium of 5 nm, it is appreciated that roughness of a crystal orientation improving layer surface after heat treatment is improved (5 nm), and is smoothened.

From Table 2, it is appreciated that an effect of the improvement of surface smoothness as a result of plating the crystal orientation improving layer surface with a slight amount of metal is exerted on another metal also. However, when palladium is plated relatively thick in 50 nm (Comparison Example 2), the unevenness of the surface becomes inversely remarkable, and no effect of the surface smoothness is recognizable. Note that this process of improving the surface smoothness does not change greatly the crystal orientation of the substrate surface.

Second Embodiment

Here, based on the similar copper substrate to the first embodiment, other metals (Ag and Au) were formed as orientation improving layers, while changing the thickness thereof. The result is shown in Table 2.

TABLE 3

| | Configuration | | | Δω | |
|---|---|---|---|---|---|
| | Substrate | Improving Layer | Δφ | TD | RD |
| Ex. 8 | Cu | Ag (500 nm) | 4.65° | 5.38° | 4.97° |
| Ex. 9 | | Ag (1000 nm) | 4.62° | 5.26° | 4.83° |
| Ex. 10 | | Au (500 nm) | 4.72° | 5.44° | 5.10° |
| Ex. 11 | | Au (1000 nm) | 4.69° | 5.35° | 5.00° |
| Com. Ex. 1 | | — | 5.17° | 7.46° | 5.87° |

Similarly to the first embodiment, an effect of the improvement of smoothness by plating with a slight amount of metal was studied. The result is shown in Table 4.

TABLE 4

| | Configuration | | | | Δω | |
|---|---|---|---|---|---|---|
| | Substrate/Improving layer | Added metal * | Surface roughness | Δφ | TD | RD |
| Ex. 8 | Cu/Ag | — | 21 nm | 4.65° | 5.38° | 4.97° |
| Ex. 12 | (500 nm) | Pd (5 nm) | 11 nm | 4.89° | 5.03° | 5.24° |
| Ex. 10 | Cu/Au | — | 20 nm | 4.72° | 5.44° | 5.10° |
| Ex. 13 | (500 nm) | Pd (5 nm) | 16 nm | 4.75° | 4.79° | 4.98° |

* Numerical values in parentheses are added amounts equivalent to film thickness From Table 3, an effect of the improvement of the orientation degrees Δφ and Δω was seen even when gold and silver were taken as the crystal orientation improving layer. Further, in this case also, the improved width of the orientation degree Δω was great, and depending on samples, there was some which has improved 2° or more. Further, from Table 4, when gold and silver were taken as the crystal orientation improving layer, while the surface roughness immediately after its formation was good as compared with nickel, the layer was slightly plated with palladium and subjected to heat treatment, thereby it was confirmed that the layer becomes a substrate more excellent in surface smoothness.

Third Embodiment

In this embodiment, a study was made on a case, in which another metal was applied as a textured substrate. A tape shaped nickel plate of 2000 μm in thickness was prepared, and this plate was set to a reduction ratio of 95% by rolling, and was cold-rolled at room temperature, and was made into a tape material of 100 μm. After rolling, the tape shaped material was heated at the temperature of 700° C. for one hour in the similar mixed gas atmosphere to the first embodiment. A nickel substrate subjected to the texturing processing was plated with silver as a crystal orientation improving layer. When performing the silver plating, silvers of 500 nm and 1000 nm were plated in a silver plating bath at temperatures of 30° C. and the current density of 1 A/dm$^2$. Similarly as described above, an evaluation of the crystal orientation was conducted. The result is shown in Table 5.

TABLE 5

| | Configuration | | Δω | |
| | Substrate | Improving Layer | Δφ | TD | RD |
|---|---|---|---|---|---|
| Ex. 14 | Ni | Ag (500 nm) | 6.13° | 6.34° | 6.10° |
| Ex. 15 | | Ag (1000 nm) | 5.97° | 6.15° | 5.94° |
| Com. Ex. 3 | | — | 6.72° | 8.66° | 6.71° |

Further, here also, similarly to the first embodiment, an effect of the improvement of surface smoothness by plating with a slight amount of metal was studied. The result is shown in Table 6.

TABLE 6

| Configuration | | | | | |
| Substrate/ Improving layer | Added metal * | Surface roughness | Δφ | Δω | |
| | | | | TD | RD |
|---|---|---|---|---|---|
| Ex. 14 | Ni/Ag (500 nm) | — | 25 nm | 6.13° | 6.34° | 6.10° |
| Ex. 16 | | Pd (5 nm) | 17 nm | 5.55° | 5.87° | 5.54° |

* Numerical values in parentheses are added amounts equivalent to film thickness From Table 5, it was confirmed that, even when a kind of substrate is changed to nickel, the thin film was formed as a crystal orientation improving layer, so that an effect of improving both of the orientation degrees of Δφ and Δω was obtained. Further, the effect of improving the surface smoothness by the slight addition of the metal was also obtained.

What is claimed is:

1. A textured substrate for epitaxial film formation having a textured metal layer having a {100}<100> cube texture at least on one surface, comprising a crystal orientation improving layer made of a metal thin film of 1 to 5000 nm in thickness on said textured metal layer surface, wherein the crystal orientation improving layer is 20 nm or less in surface roughness (Ra), and wherein the crystal orientation improving layer is formed by epitaxial growth;
wherein differences between orientation degrees (ΔΦ and Δω) in said textured metal layer surface and orientation degrees (ΔΦ and Δω) in said crystal orientation improving layer surface are both 0.1 to 3.0°, wherein both a plate width direction (TD) and rolling direction (RD) measurement of orientation degree Δω the have a difference of 0.1 to 3.0° between the textured metal layer surface and the crystal orientation improving layer surface.

2. The textured substrate for epitaxial film formation according to claim 1, wherein a metal constituting the crystal orientation improving layer is selected from nickel, copper, silver, aluminum, gold, platinum, palladium, rhodium, and iridium.

3. The textured substrate for epitaxial film formation according to claim 2, wherein the crystal orientation improving layer includes another metal, different from the metal constituting the crystal orientation improving layer, on its surface, and said another metal is equivalent to a film thickness which is 30 nm or less.

4. The textured substrate for epitaxial film formation according to claim 3, wherein the another metal is a metal solid-soluble with the metal constituting the crystal orientation improving layer.

5. The textured substrate for epitaxial film formation according to claim 3, wherein the another metal is selected from platinum, gold, silver, palladium, rhodium, and iridium.

6. A surface improving method of a textured substrate for epitaxial film formation having a textured metal layer at least on one surface, said textured substrate having a textured metal layer having a {100}<100> cube texture at least on one surface, which method comprises the step of epitaxially growing a crystal orientation improving layer on said textured metal layer surface, which crystal orientation improving layer is made of a metal thin film of 1 to 5000 nm in thickness, and wherein the crystal orientation improving layer is 20 nm or less in surface roughness (Ra); wherein differences between orientation degrees (ΔΦ and Δω) in said textured metal layer surface and orientation degrees (ΔΦ and Δω) in said crystal orientation improving layer surface are both 0.1 to 3.0°, wherein both a plate width direction (TD) and rolling direction (RD) measurement of orientation degree Δω must have a difference of 0.1 to 3.0° between the textured metal layer surface and the crystal orientation improving layer surface.

7. The surface improving method of a textured substrate for epitaxial film formation according to claim 6, wherein the formation of the metal thin film is by plating.

8. The surface improving method of a textured substrate for epitaxial film formation according to claim 6, wherein the metal thin film surface is added with another metal different from said metal constituting the metal thin film equivalent to 30 nm or less of the film thickness, and subsequently a heat treatment is performed.

9. The surface improving method of a textured substrate for epitaxial film formation according to claim 8, wherein the addition of the another metal is by plating.

10. The surface improving method of a textured substrate for epitaxial film formation according to claim 7, wherein the another metal is selected from platinum, gold, silver, palladium, rhodium, and iridium.

11. The surface improving method of a textured substrate for epitaxial film formation according to claim 8, wherein heat treatment temperature is 400° C. or more, and is a melting point or less of the another metal.

12. The surface improving method according to claim 6, wherein a metal constituting the crystal orientation improving layer is selected from nickel, copper, silver, aluminum, gold, platinum, palladium, rhodium, and iridium.

* * * * *